United States Patent
Irsigler et al.

(10) Patent No.: US 8,072,084 B2
(45) Date of Patent: Dec. 6, 2011

(54) INTEGRATED CIRCUIT, CIRCUIT SYSTEM, AND METHOD OF MANUFACTURING

(75) Inventors: Roland Irsigler, Munich (DE); Harry Hedler, Germering (DE); Stephan Dobritz, Dresden (DE)

(73) Assignee: Qimonda AG, Munich (DE)

( * ) Notice: Subject to any disclaimer, the term of this patent is extended or adjusted under 35 U.S.C. 154(b) by 381 days.

(21) Appl. No.: 11/855,734

(22) Filed: Sep. 14, 2007

(65) Prior Publication Data
US 2009/0072398 A1   Mar. 19, 2009

(51) Int. Cl.
*H01L 23/482* (2006.01)

(52) U.S. Cl. . 257/778; 257/741; 257/773; 257/E23.015; 257/E23.01; 257/E23.078; 257/E23.194; 257/181; 257/178; 257/688; 257/747

(58) Field of Classification Search ............... 257/734, 257/59, 433, 787, E31.117, 741, 181, 688, 257/686, E23.065, E23.177, 773, E23.015, 257/778, E23.01, E23.078, E23.194, 178, 257/747
See application file for complete search history.

(56) References Cited

U.S. PATENT DOCUMENTS

| | | | | |
|---|---|---|---|---|
| 4,897,918 A | * | 2/1990 | Osaka et al. | 29/830 |
| 6,440,773 B1 | * | 8/2002 | Usami | 438/107 |
| 6,936,500 B2 | * | 8/2005 | Lindstedt | 438/113 |
| 6,972,495 B2 | * | 12/2005 | Fjelstad | 257/778 |
| 7,719,121 B2 | * | 5/2010 | Humpston et al. | 257/784 |
| 2002/0084532 A1 | * | 7/2002 | Neogi et al. | 257/778 |
| 2005/0120553 A1 | * | 6/2005 | Brown et al. | 29/884 |
| 2005/0133929 A1 | * | 6/2005 | Howard | 257/774 |
| 2005/0161493 A1 | * | 7/2005 | Ference et al. | 228/180.22 |
| 2006/0214311 A1 | * | 9/2006 | Lai et al. | 257/783 |
| 2006/0281363 A1 | * | 12/2006 | Trezza | 439/502 |

* cited by examiner

*Primary Examiner* — Ngan Ngo
*Assistant Examiner* — Benjamin Tzu-Hung Liu
(74) *Attorney, Agent, or Firm* — Dicke, Billig & Czaja, PLLC

(57) ABSTRACT

An integrated circuit, a circuit system and method of manufacturing such is disclosed. One embodiment provides a circuit chip including a first contact field on a chip surface; and an insulating layer on the chip surface. The insulating layer includes a flexible material. A contact pillar is coupled to the first contact field and extends from the chip surface through the insulating layer. The contact pillar includes a conductive material.

25 Claims, 11 Drawing Sheets

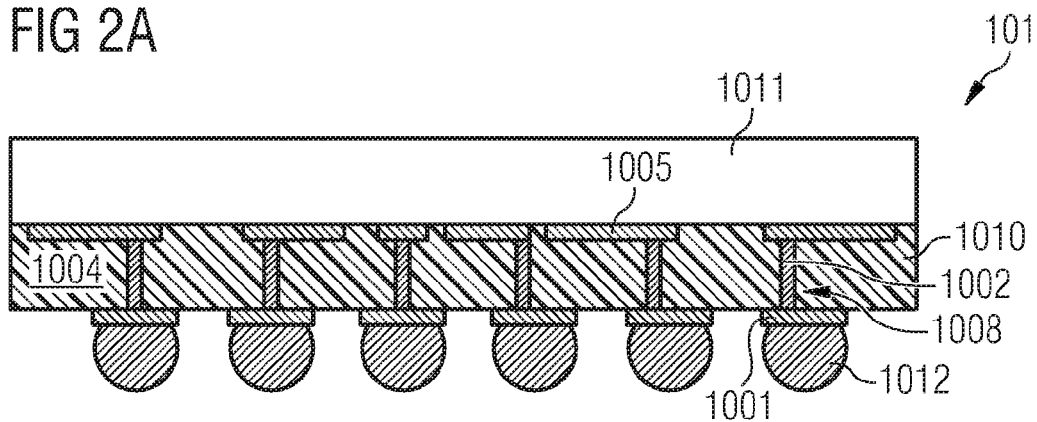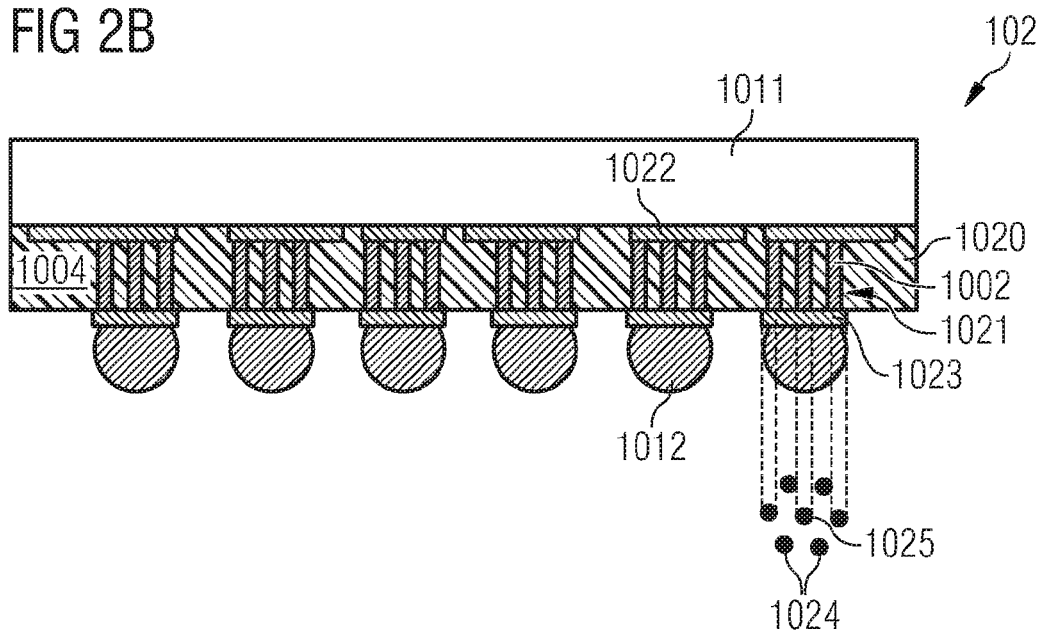

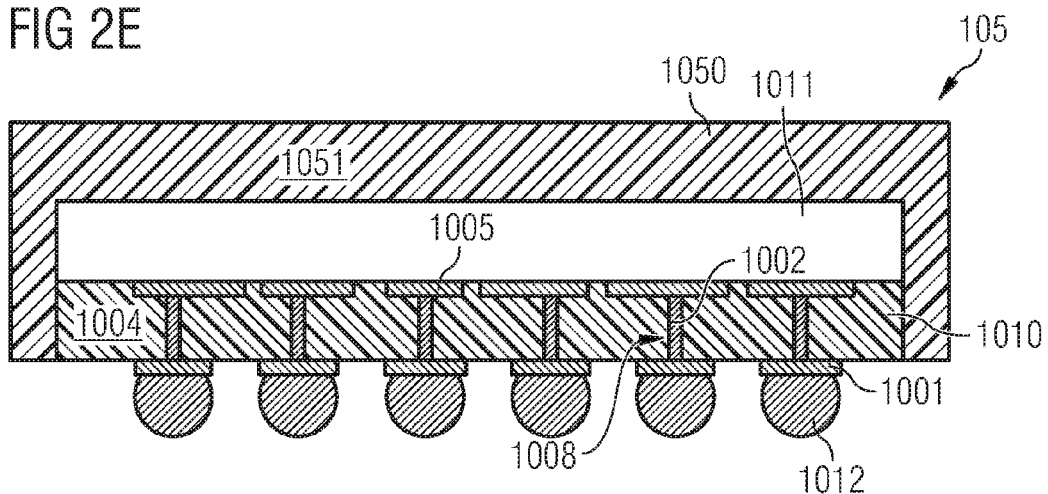
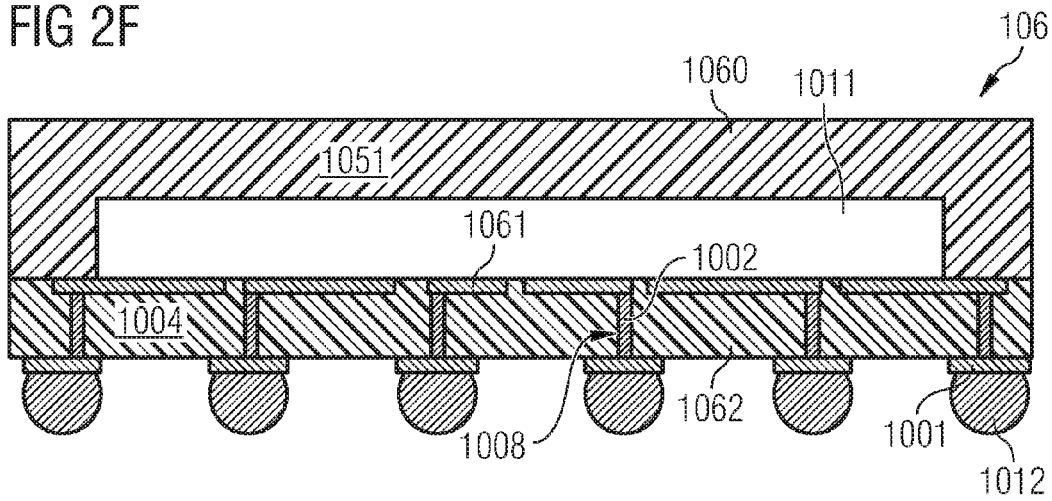

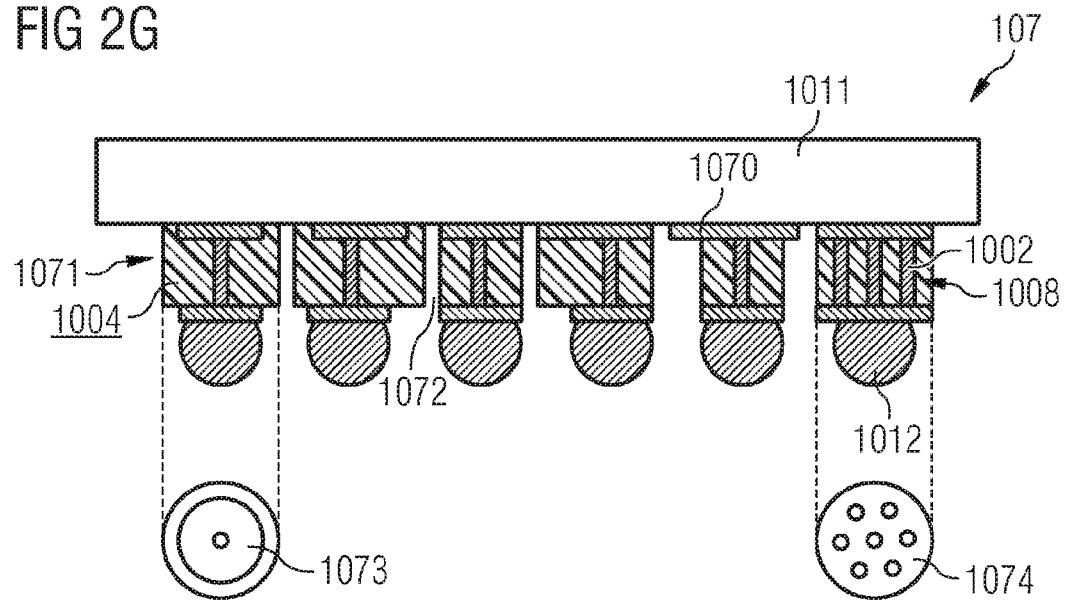
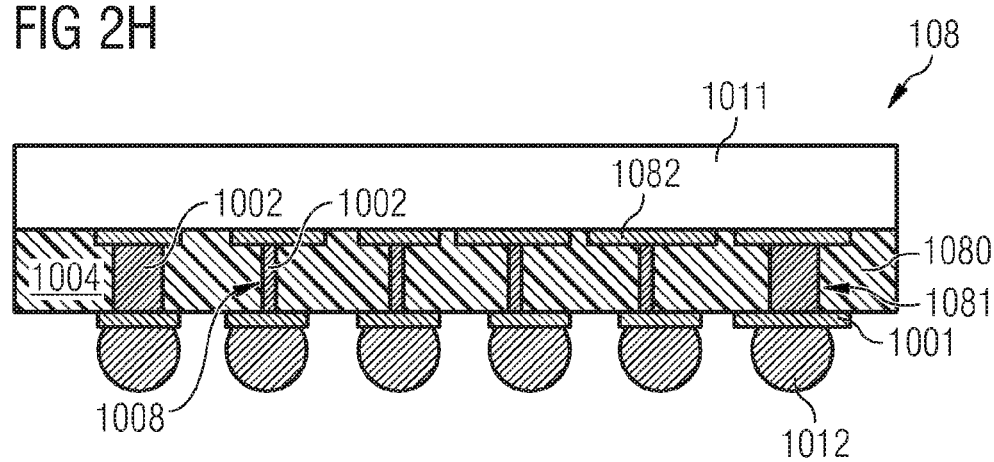

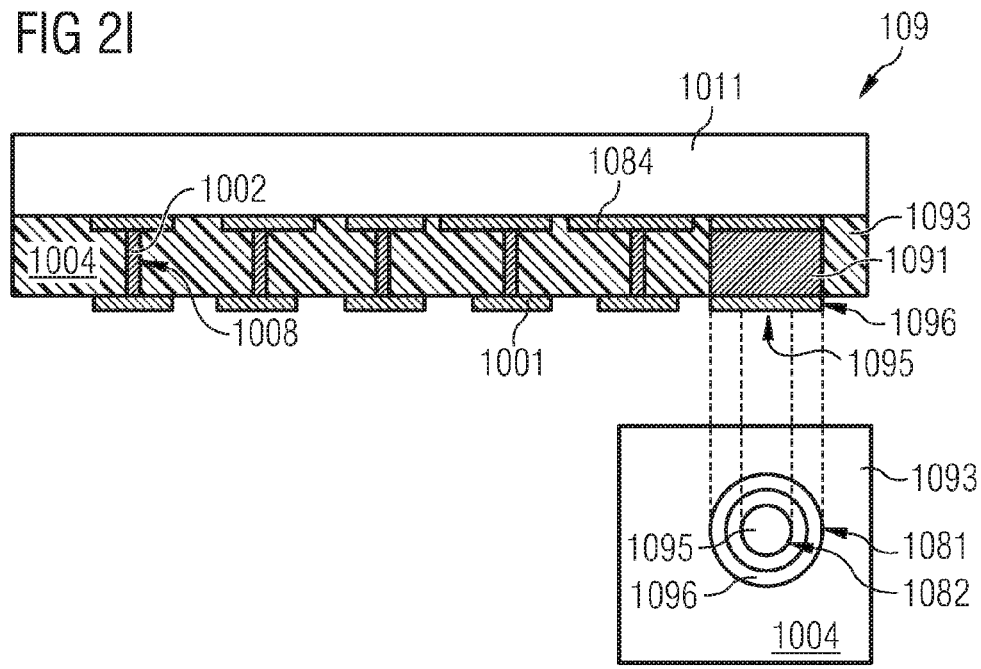
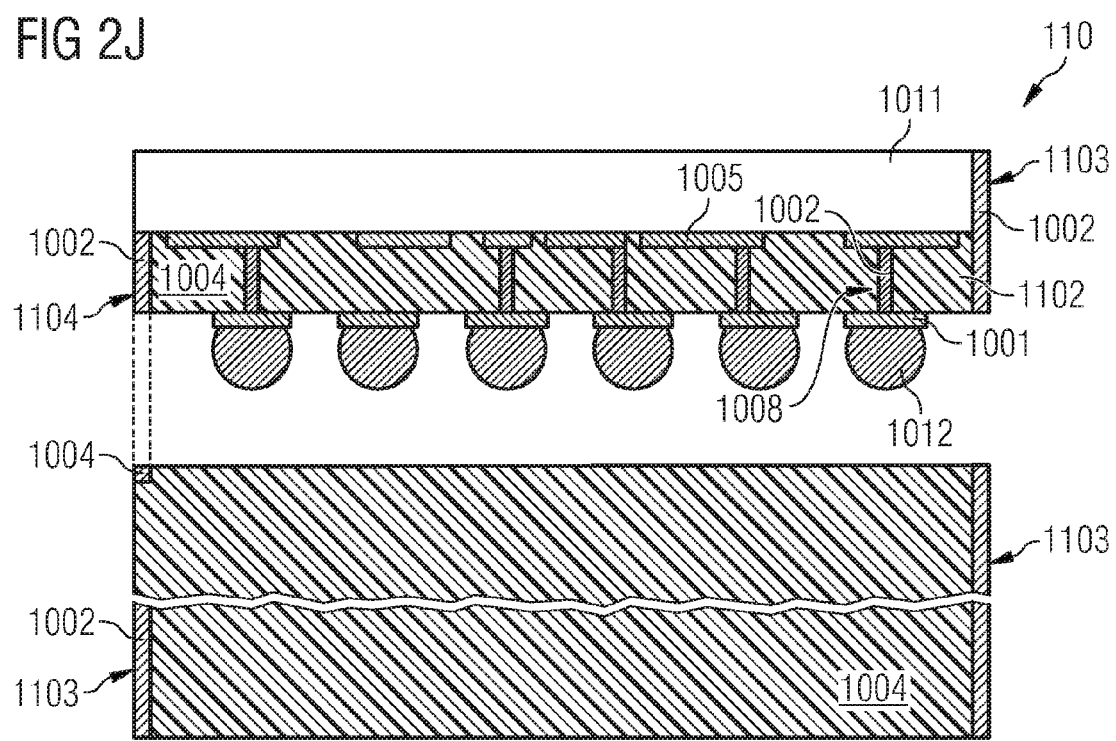

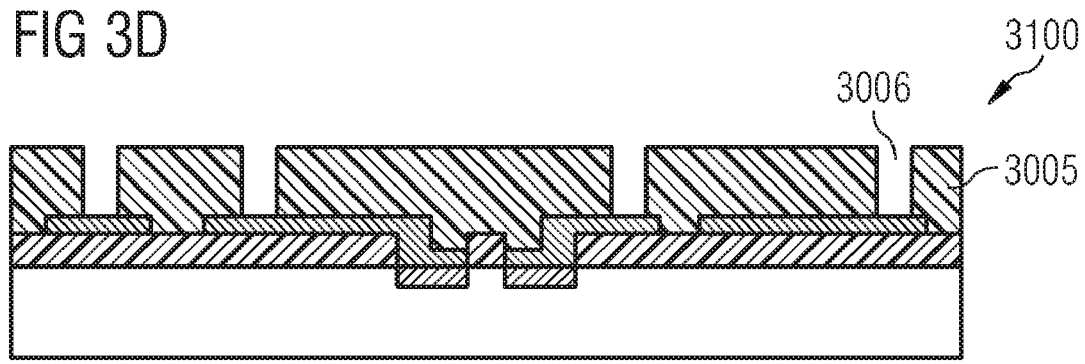
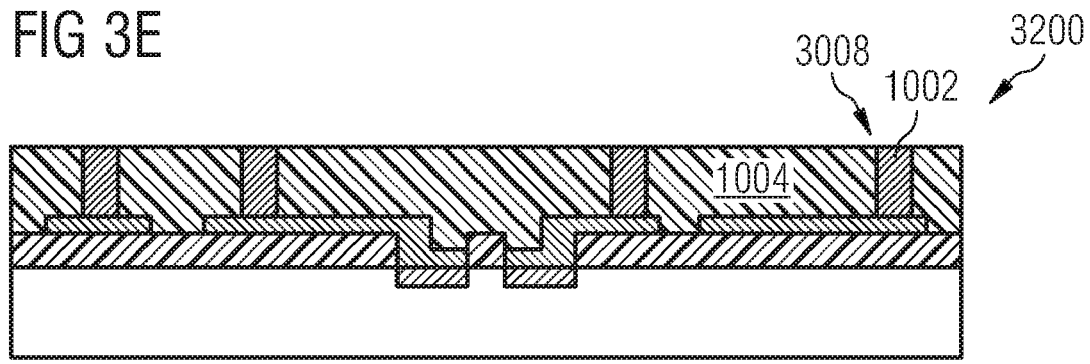
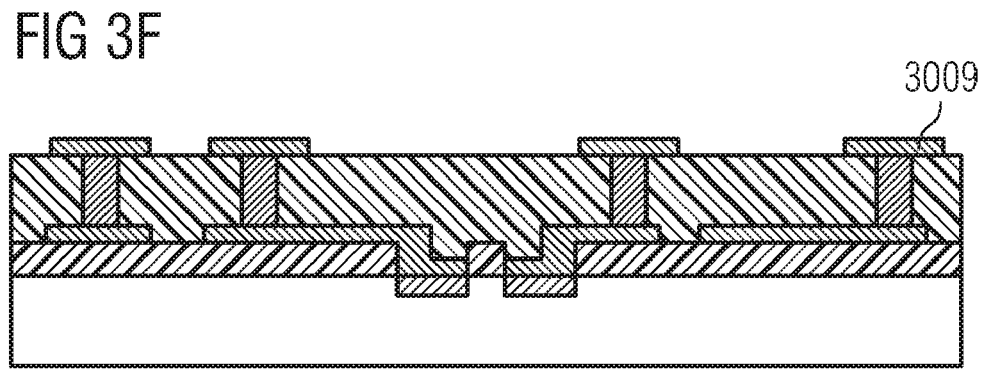

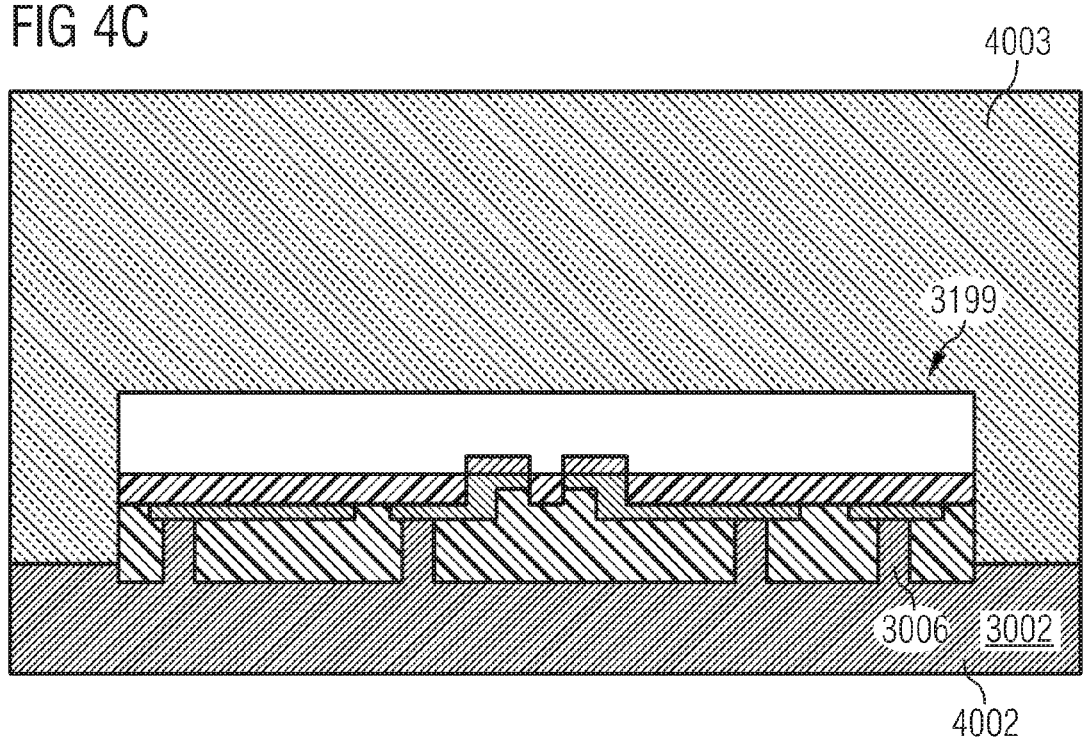
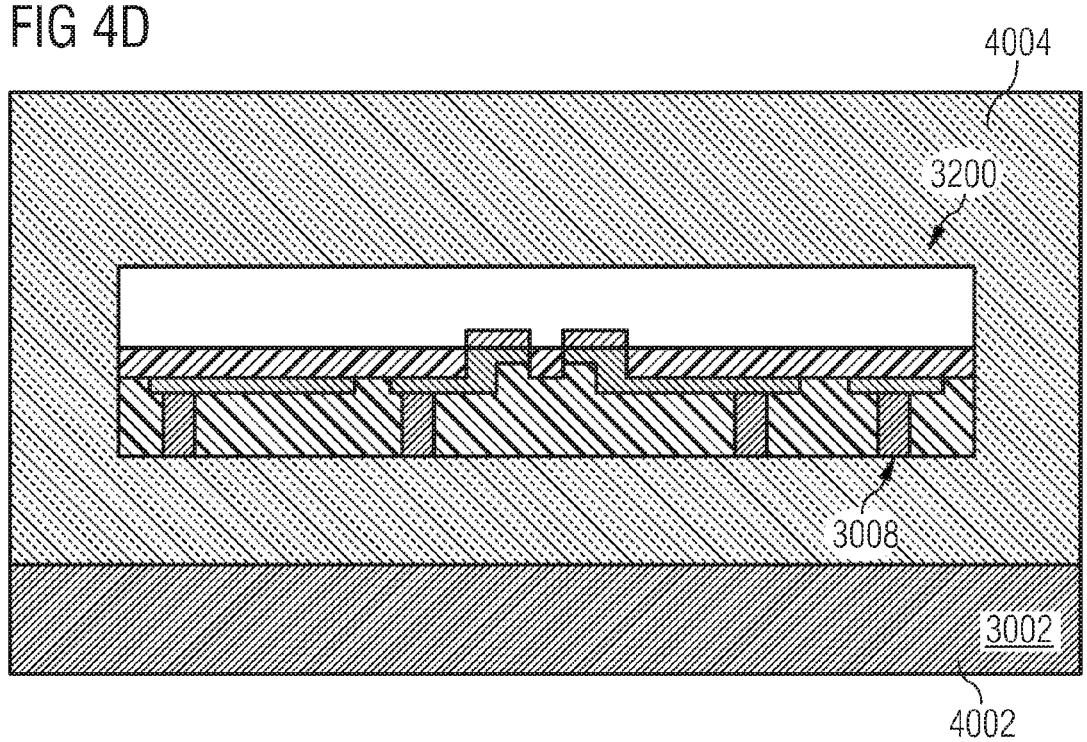

INTEGRATED CIRCUIT, CIRCUIT SYSTEM, AND METHOD OF MANUFACTURING

BACKGROUND

Integrated circuit systems include integrated circuits having circuit chips arranged on a semiconductor substrate coupled to a circuit board. Circuit systems, integrated circuits, and circuit boards may be subjected to temperature variations. A difference in the thermal expansion coefficients of the constituent materials and components may result in mechanical stress or even a rupture of electrical connections and/or components of the circuit system.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 2A through 2J illustrate integrated circuits according to one or more embodiments.

FIGS. 3A through 3H illustrate an integrated circuit and a circuit system in various stages during manufacturing according to one embodiment.

FIGS. 4A through 4D illustrate an integrated circuit in various stages during manufacturing according to one embodiment.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1A:
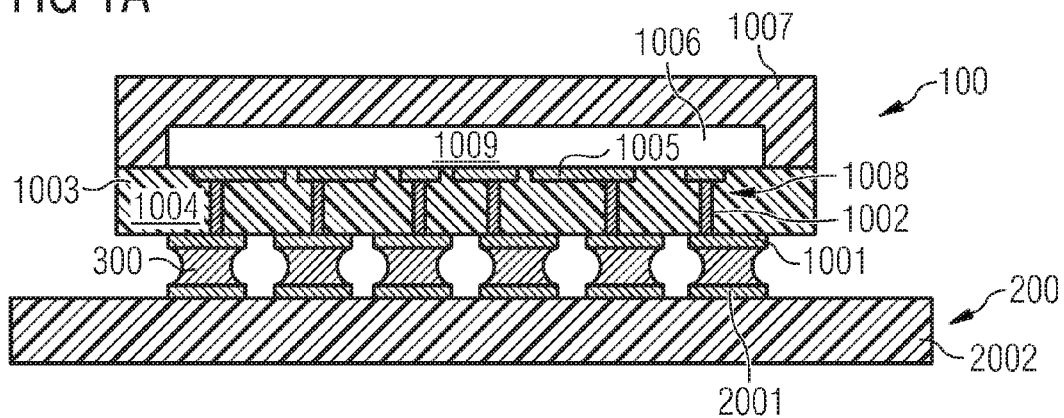
FIGS. 1A through 1C illustrate schematic cross-sectional views of a circuit system according to one embodiment.

FIG. 1A illustrates an integrated circuit system according to one embodiment. The circuit system includes an integrated circuit 100 and a circuit board 200. The integrated circuit 100 includes contact pads 1001 on a circuit surface which faces the circuit board 200. The circuit board 200 includes contact pads 2001 being arranged on a board surface, which faces the integrated circuit 100. The integrated circuit 100 may be connected to the circuit board 200 by using solder connections 300 connecting contact pads 2001 to respective contact pads 1001 of the integrated circuit 100.

The integrated circuit 100 includes a circuit chip 1006, which, in turn, may include a semiconductor substrate, an integrated circuit, a memory chip, a processor chip, an integrated circuit chip, and/or a stack thereof. On a chip surface of the circuit chip 1006 there are arranged signal lines 1005. The signal lines 1005 may include or form a redistribution layer (RDL) such to reroute signals from one position on the chip surface to another. On the chip surface of the circuit chip 1006 there is arranged an insulating layer 1003 which includes a flexible material 1004. The integrated circuit 100 further includes contact pillars 1008 which are arranged, at least in part, in the insulating layer 1003 and include a conductive material 1002. A package material 1007 may further encapsulate the circuit chip 1006 and may reach down to the insulating layer 1003.

The circuit board 200 includes a board material 2002, which may possess a coefficient of thermal expansion (CTE), such as a second coefficient of thermal expansion $CTE_2$. The circuit chip 1006 of the integrated circuit 100 may include a chip material 1009, which possesses a coefficient of thermal expansion, such as a first coefficient of thermal expansion $CTE_1$. In general, the two CTEs, $CTE_1$ and $CTE_2$, may differ, although they may be approximately equal and/or engineered such to be closely matched. However, even a small difference in the two CTEs, such as 10% or 1%, may result in different thermal expansion properties. For example, the chip material 1009 may include a semiconductor, such as silicon, whereas the circuit board 200 may include a board material 2002, such as an epoxy resin and/or glass. Respective CTEs for a chip may be in a range of 1 ppm to 5 ppm, and for the board in a range of 10 ppm to 20 ppm. As a further example, circuit systems such as wafer level packages (WLP) may require a maximum distance from an outer solder connection to a circuit chip center, since, by exceeding that maximum distance, rupture of connections may occur. Such a maximum distance may be denoted by a distance to neutral point (DNP).

Since circuit systems, integrated circuits, and circuit boards as such may be subject to temperature variations, a difference in the thermal expansion coefficients of the constituent materials and components, may, in turn, result in mechanical stress or even a rupture of electrical connections and/or components of the circuit system. Examples of materials and components which may be prone to such a mechanical stress include the circuit chip 1006, the contact pads 1001, the contact pads 2001, the circuit board 200, and/or the solder connections 300.

Figure 1B:
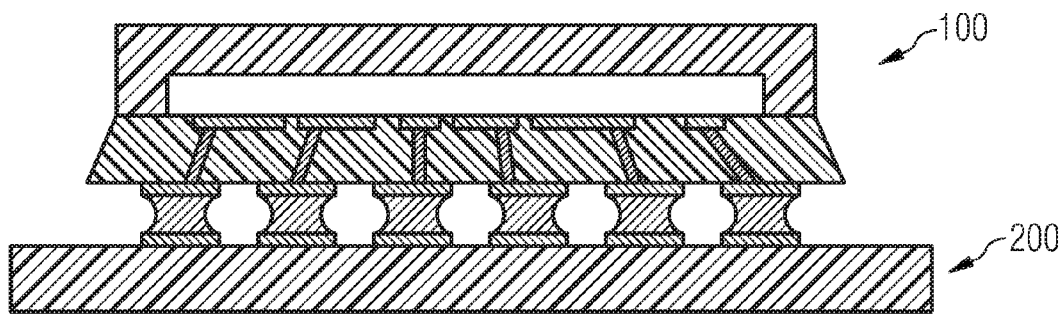

FIG. 1B illustrates a schematic cross-sectional view of the circuit system, including the integrated circuit 100 and the circuit board 200, according to one embodiment. As illustrated in FIG. 1B a system temperature has been changed in respect to the situation as has been illustrated and described in conjunction with FIG. 1A. Since the chip material 1009 and the board material 2002 may possess different coefficients of thermal expansion, an effective expansion of the board material 2002 and chip material 1009, and, as a result, an effective expansion of the circuit board 200 and the integrated circuit 100 may differ. As illustrated here, the circuit board 200 has expanded more than the integrated circuit 100. For the sake of clarity, the effect of expansion may have been illustrated in an exaggerated form, hence, no comparison to real values of thermal expansions should be made according to the drawings and/or the scale thereof.

According to one embodiment, the insulating layer 1003 includes a flexible material 1004. This flexible material 1004 may be structured by using photo-lithography or, in general, radiation lithography. The flexible material 1004 may furthermore be an insulating material, and may include any material of the group of a photoresist material, a permanent photoresist material, a chemically amplified photo resist, a resin, an epoxy resin, epoxy bis-phenol-A novolakoliomer, a sulphonium crivello salt, γ-butyro-lacton, cyclo-pentanone, polymethylmethaacrylate, TMMF, TMMR, and NANO™ SU-8, and combinations thereof.

Accordingly, the contact pillars 1008 may include a conductive material 1002. The conductive material 1002 may furthermore be a conductive material, such as to form a conducting contact pillar 1008. The conductive material 1002 may be or include a low melting point material, a solder material, a solder alloy, a bond wire material, tin, copper, silver, lead, bismuth, indium, gold, and/or aluminium. The melting point of the conductive material 1002 may not exceed the temperature stability of the flexible material 1004.

Since in FIG. 1B there is illustrated a situation, wherein the circuit board 200 expands more than the integrated circuit 100, and/or the circuit chip 1006, the flexible material 1004 of the insulating layer 1003 and the conductive material 1002 of the contact pillars 1008 may compensate for such a different expansion. In such a way, a rupture and/or decrease of conductivity of a connection between the integrated circuit 100 and the circuit board 200 may be prevented. In this way, the circuit system, including the integrated circuit 100 and the circuit board 200 may be subjected to an increased number of thermal cycles, an increased number of operation cycles, an increased number of start-up sequences, to an increased difference between a minimum and a maximum storage temperature, and/or to an increased difference between a minimum and a maximum operation temperature. In such a way, the circuit system may also have a larger maximum distance of the outer solder connection to a circuit chip center (DNP). Furthermore, the integrated circuit 100 and the circuit board 200 may be subjected to an increased process temperature during soldering. The mechanical properties of the flexible material 1004 and the conductive material 1002 may provide such a compensation.

Figure 1C:
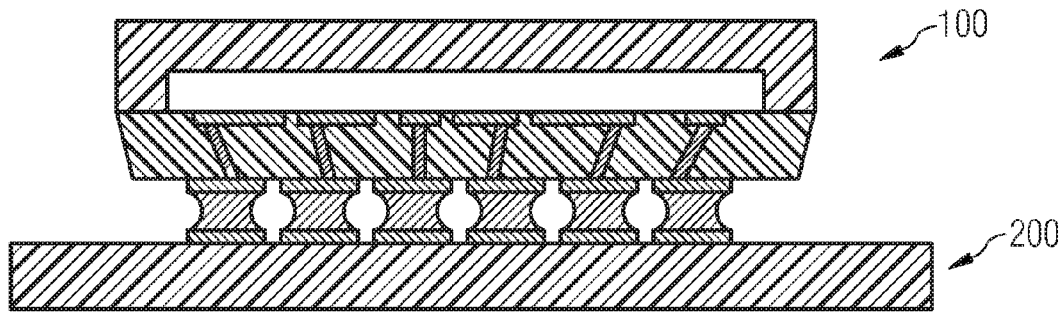

As illustrated in FIG. 1C, the situation of different expansions of the circuit chip 1006 and the circuit board 200 may be opposite to the situation as has been described in conjunction with FIG. 1B. In such a case, the circuit chip 1006 and/or the integrated circuit 100 may expand more than the circuit board 200, or the circuit board 200 may expand less than the integrated circuit 100 and/or the circuit chip 1006. The mechanical properties of the flexible material 1004 and the conductive material 1002 may provide also in such a situation a reliable contacting and/or a suppression of any contact ruptures or an undesired attenuation of the conductivity of connections within the integrated circuit 100, the circuit board 200, or the circuit system. As illustrated here, the contact pillar 1008 and the insulating layer 1003 are bended inward, such to compensate for the larger expansion of the integrated circuit 100 or the lesser expansion of the circuit board 200.

FIG. 2A illustrates an integrated circuit 101 according to one embodiment. The integrated circuit 101 includes a circuit chip 1011, such as the circuit chip 1006, which has been described in conjunction with FIGS. 1A through 1C. On a chip surface of the circuit chip 1011 there are arranged the signal lines 1005. The signal lines 1005 provide signal routing from one position of the chip surface of the circuit chip 1011 to a respective position of a contact pillar 1008 within that plane. On the chip surface of the circuit chip 1011 there is arranged an insulating layer 1010, including the flexible material 1004. A thickness of the insulating layer 1010 may be in a range of 20 µm to 100 µm. The contact pillars 1008, including the conductive material 1002, couple the respective signal line 1005 to a contact pad 1001, which is arranged on a circuit surface of the integrated circuit 101. A diameter of the contact pillars 1008 may be in a range of 10 µm to 50 µm.

On the contact pads 1001 there may be arranged solder balls 1012. Such solder balls 1012 may provide a reliable connection of the integrated circuit 101 to an external circuitry, such as a circuit board, a printed circuit board (PCB), or a circuit system. In general, such solder balls may also be omitted, since integrated devices may also be connected to a circuit system by using providing a solder paste onto the integrated circuit and/or a respective circuit board prior to a soldering process. A cross section of the contact pillars 1008 may include a diameter in a range of 15 µm to 50 µm, a diameter of a contact pad 1001 may be in a range of 150 µm to 250 µm, and a diameter of a solder ball 1012 may be in a range of 150 µm to 400 µm.

FIG. 2B illustrates an integrated circuit 102 according to one embodiment. Accordingly, the integrated circuit 102 includes groups 1021 of contact pillars, which include the conductive material 1002. The groups 1021 of contact pillars may connect signal lines 1022 to contact pads 1023. The signal lines 1022 are arranged on a chip surface of the circuit chip 1011. In turn, the contact pads 1023 are arranged on a circuit surface of the integrated circuit 102. The groups 1021 of the contact pillars may provide an increased conductivity, a conductivity for an increased current, a matched impedance, an increased conductivity for high frequency signals, and/or a waveguide. The circuit chip 1011 may require such an increased conductivity and/or a matched impedance connection. The integrated circuit 102 may furthermore include more than one group 1021 of contact pillars, different groups of contact pillars, and/or groups 1021 of contact pillars and single contact pillars. Solder balls 1012 may be arranged on the contact pads 1023.

The groups 1021 of the contact pillars may include outer contact pillars 1024 and a central contact pillar 1025, the outer contact pillars 1024 being arranged along an outer circle in a coaxial configuration around the central contact pillar 1025. In this way, a coaxial configuration may be achieved, and the outer contact pillars 1024 may be coupled to a common reference potential, such as a ground potential, whereas the central contact pillar 1025 may carry a high-frequency signal or an electromagnetic wave. The radius of the outer contact pillars 1024, the distance of an outer contact pillar 1024 to the central contact pillar 1025, and/or the dielectric properties of the flexible material 1004 may determine a characteristic frequency for a transmission of high frequency signals. High frequency (HF) signals may be any signals with an effective frequency above 100 MHz, above 500 MHz, or above 1 GHz.

Figure 2C:
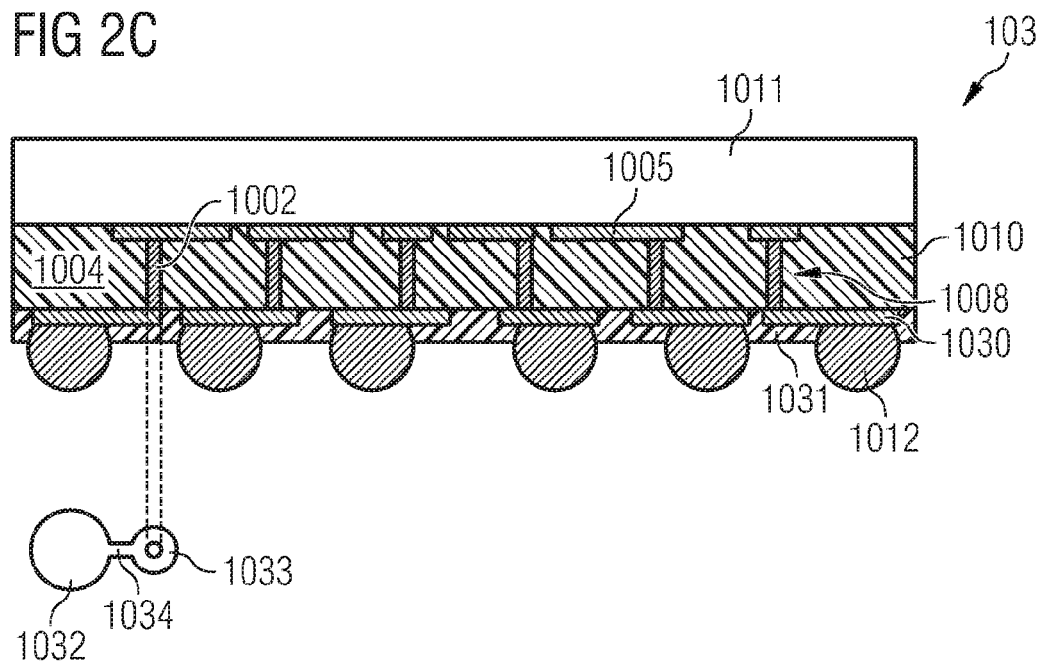

FIG. 2C illustrates an integrated circuit 103 according to one embodiment. The insulating layer 1010 is arranged on the circuit chip 1011 and connected by using signal lines 1005 to contact pillars 1008. The insulating layer 1010 includes the flexible material 1004, whereas the contact pillars 1008 include the conductive material 1002.

According to one embodiment, there is arranged a further signal line 1030 on the insulating layer 1010. The further signal line 1030 may be part or form a second redistribution layer (RDL). In conjunction with the signal lines 1005, the further signal lines 1030 may provide further redistribution of the signals from one position to another. In this way, signal path crossings may be achieved without short circuiting the respective signal lines. The signal lines 1030 may include contact pads 1032, on which there may be arranged solder balls 1012. The signal lines 1030 may further include a further contact pad 1033, which is coupled to the respective contact pillar 1008. The further contact pad 1033 is coupled to the contact pad 1032 via signal lines 1034. A solder mask and/or a solder stop material 1031 may be arranged on the insulating layer 1010. The solder mask 1031 may prevent an undesired short circuiting of further signal lines 1030, upon liquefaction of the solder balls 1012.

Figure 2D:
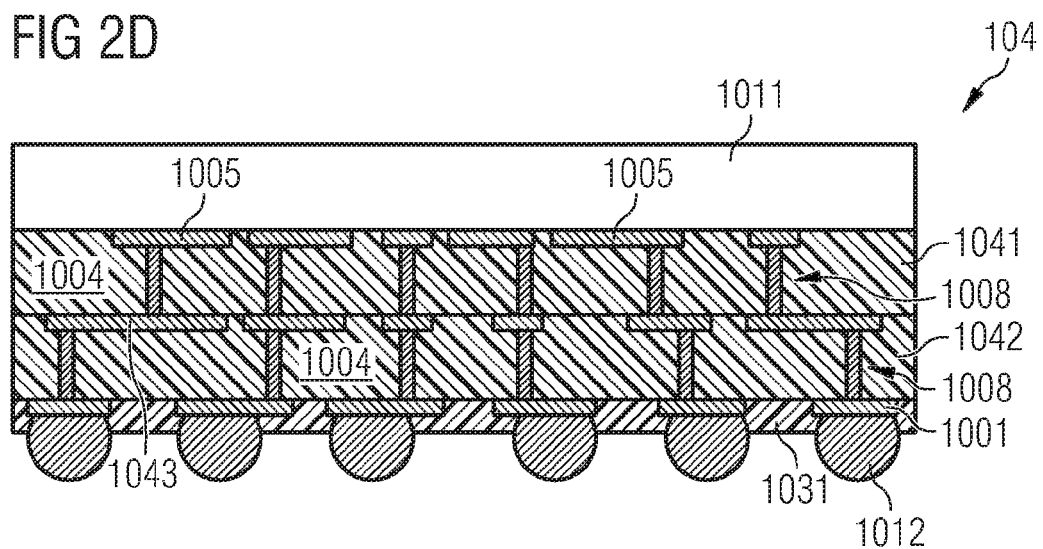

FIG. 2D illustrates an integrated circuit according to another embodiment. The integrated circuit 104 includes the circuit chip 1011 on which there are arranged the signal lines 1005. According to this embodiment, the integrated circuit 104 includes a first insulating layer 1041 and a second insulating layer 1042. The first insulating layer 1041 and the second insulating layer 1042 include the flexible material 1004. In the two insulating layers 1041, 1042 there are arranged contact pillars 1008. On a circuit surface of the second insulating layer 1042 there are arranged the contact pads 1001, on which, in turn, there may be arranged solder balls 1012. On the second insulating layer 1042 there may be further arranged the solder mask 1031.

According to this embodiment, the circuit chip 1011 is connected to the contact pads 1001 by using the signal lines 1005, contact pillars 1008 within the first insulating layer 1041, further signal lines 1043, and the contact pillars 1008 within the second insulating layer 1042. The provision of a further signal line 1043, and/or the provision of the second insulating layer 1042 may allow further redistribution of signals from one position of a circuit chip plane to another. In addition to this, signal crossings may be realized without short circuiting.

FIG. 2E illustrates an integrated circuit according to one embodiment. The integrated circuit 105 includes the circuit chip 1011, the insulating layer 1010, the contact pads 1001 on a circuit surface on the insulating layer 1010, contact pillars 1008, and the signal lines 1005. The contact pads 1001 are coupled to the circuit chip 1011 by using the contact pillars 1008 and the signal lines 1005. On the contact pads 1001 there may be arranged the solder balls 1012.

According to this embodiment, the integrated circuit 105 includes a package 1050, which, in turn, includes a package material 1051. The package material 1051 may include a resin, a ceramic material, a polymer, and/or a combination thereof. The package material 1051 of the package 1050, at least in part, surrounds the circuit chip 1011 and the insulating layer 1010. The package material 1051 may possess mechanical properties, such as to allow for an expansion or contraction of the insulating layer 1010 and/or the circuit chip 1011. Furthermore, in the case that the package material 1051 possesses a reduced flexibility in respect to the flexible material 1004, the mechanical properties of the flexible material 1004 may be such that to compensate for the confinement by the package 1050 according to this embodiment. The integrated circuit package as illustrated in FIG. 2E may be also referred to as a fan-in universal package.

FIG. 2F illustrates an integrated circuit according to one embodiment. The integrated circuit 106 includes the circuit chip 1011 which is coupled to signal lines 1061. According to this embodiment, the insulating layer 1062, including the flexible material 1004, extends from a footprint of the circuit chip 1011. The signal lines 1061 may further extend from such a footprint and provide connections to contact pads 1001, which may, in this way, be arranged on a larger area than the footprint of the circuit chip 1011 and/or outside such a chip footprint. Although modern circuit chips may provide a plurality of contacts on a limited circuit chip surface, such as in a high density configuration, this contact density may not be matched or cannot be matched by solder connections and/ or contact pads toward an external circuitry, such as a circuit board or a printed circuit board (PCB).

According to this embodiment, the enlarged insulating layer 1062—in respect to the footprint of the circuit chip 1011—may provide both a redistribution of signals to a larger area and/or a flexibility, in the case that the material of the circuit chip 1011 and a material of an external circuitry possess different coefficients of thermal expansion. The integrated circuit 106 further includes a package 1060, including the package material 1051. The package 1060 surrounds, at least in part, the circuit chip 1011 and may form an interface to the insulating layer 1062. In this way, the insulating layer 1062 may be arranged as a continuous and/or smooth layer on the circuit chip 1011 and the package 1060. The flexible material 1004 of the insulating layer 1062 may in this way expand or contract in order to provide a compensation of different coefficients of thermal expansion (CTE). The integrated circuit package as illustrated in FIG. 2F may be also referred to as a fan-out universal package.

FIG. 2G illustrates an integrated circuit according to one embodiment. The integrated circuit 107 includes the circuit chip 1011. On a chip surface of the circuit chip 1011 there are arranged signal lines 1070 and an insulating layer 1071. On the insulating layer 1071 there are arranged contact fields 1073 and contact fields 1074. On the contact fields there may be arranged solder balls 1012.

According to this embodiment, the insulating layer 1071 includes trenches 1072. The trenches 1072 may reach to the chip surface of the circuit chip 1011. However, the trenches 1072 may be such that their depth is less than the thickness of the insulating layer 1071, in this way, forming an insulating layer 1071 which continuously covers the circuit chip 1011. Accordingly, the insulating layer 1071 provides islands of the flexible material 1004. Within such an island, one or more contact pillars 1008 may be arranged, such as to couple the signal lines 1070 to respective contact pads. One island may include just one contact pillar or a group thereof.

The trenches 1072 may be provided such to provide an enhanced flexibility of the insulating layer 1072, rendering the manufacturing more independent from material properties: In this way, the flexibility of the flexible material 1004 may be reduced and/or allows the application of a less flexible or unflexible material for the flexible material 1004. In the case that one island of the insulating layer 1071 includes only one contact pillar, a contact pad 1073 may be coupled to the respective contact pillar, and such an island may, over all, be arranged as a coaxial column, including the flexible material 1004 and, in the center, the conductive material 1002.

FIG. 2H illustrates an integrated circuit according to one embodiment. The integrated circuit 108 includes the circuit chip 1011 and an insulating layer 1080. The insulating layer 1080 is arranged on a chip surface of the circuit chip 1011. Signal lines 1082 provide a routing of signals from one position of the chip surface to the position of a respective contact pillar 1008 and/or contact pillar 1081. The contact pillars 1008, 1081 include a conductive material 1002, whereas the insulating layer 1080 includes the flexible material 1004. On a circuit surface there are arranged contact pads 1001, on which, in turn, there may be arranged solder balls 1012.

According to this embodiment, the contact pillar 1081 provides an enhanced cross section in respect to the contact pillar 1008. In this way, a contact pillar 1081 may provide an increased conductance, and/or may conduct a greater current than the contact pillars with a smaller cross section, such as the contact pillars 1008. In this way, contacts with increased conductivity, for example, for using power supply or other power applications, may be provided to the circuit chip 1011, whereas contacts that require a normal conductivity, such as signal contacts, may be provided with a smallest possible cross section in the insulating layer 1080. In this way, a high density configuration of contact pillars 1008 may be provided, while, at the same time, allowing for a provision of an increased and/or enhanced conductivity for selected contacts.

FIG. 2I illustrates an integrated circuit according to one embodiment. The integrated circuit 109 includes the circuit chip 1011, signal lines 1094, contact pillars 1008, contact pads 1001, and an insulating layer 1093. The signal lines 1094 couple respective signals from the circuit chip 1011 by using the contact pillars 1008 to the respective contact pads 1001.

According to this embodiment, the integrated circuit 109 includes a coaxial configuration of a center contact pillar 1092 and a surrounding hollow contact column 1091. The contact column 1091 and the center contact pillar 1092 are embedded in the flexible material 1004. A respective signal line 1094 may conduct a high frequency signal or an electromagnetic wave from the circuit chip 1011 to a respective contact pad configuration on the circuit surface on the insulating layer 1093. Such a contact pad configuration may include a center pad 1095 and a ring pad 1096. The outer diameter of the center contact pillar 1092, the inner diameter of the hollow contact column 1091, and/or the dielectric properties of the flexible material 1004 may be engineered, selected, and/or be such that a characteristic frequency for the transmission of a high frequency signal is achieved.

FIG. 2J illustrates an integrated circuit according to one embodiment. An integrated circuit 110 includes the circuit chip 1011, signal lines 1005, contact pillars 1008, contact pads 1001, solder balls 1012, and an insulating layer 1102. The insulating layer 1102 includes the flexible material 1004, whereas the contact pillars 1008 include the conductive material 1002.

According to this embodiment, the conductive material 1002 is furthermore arranged on an edge or on a side face of the integrated circuit 110. This may form a corner column 1104 including the conductive material 1002. The corner column 1104 may extend through the insulating layer 1102 and/or the circuit chip 1101. The integrated circuit 110 may further include a side plate 1103 including the conductive material 1002 on a side face of the integrated circuit 110. The corner column 1104 and/or the side plate 1103 may provide a mechanical protection of the integrated circuit 110 during manufacturing, connecting, assembly, and/or operation.

Figure 3A:
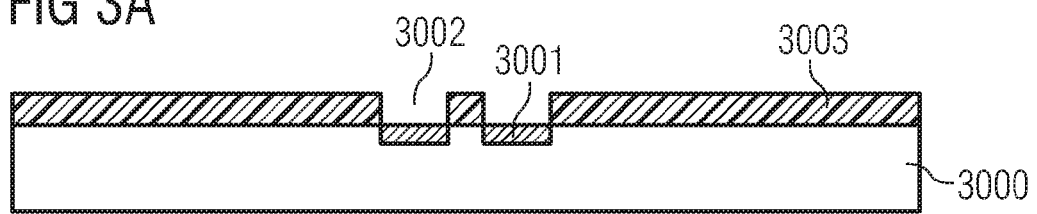

FIG. 3A through 3H illustrate an integrated circuit and a circuit system including the integrated circuit in various stages during manufacturing according to one embodiment. As illustrated in FIG. 3A a circuit chip 3000 is provided. The circuit chip 3000 may include a semiconductor substrate or a stack thereof. The semiconductor substrate may include functional entities, such as transistors, resistors, conductors, capacitors, diodes, inductors, insulators, dielectrics, capacitors, light-emitting diodes, semiconductor lasers, light sensors, and related entities such to form an integrated circuit. Examples of the circuit chip 3000 include a memory chip, a processor chip, an integrated circuit chip, a signal processor chip, and the like.

The circuit chip 3000 includes contact fields 3001 on a chip surface of the circuit chip 3000. The contact fields 3001 are coupled to the functional entities, such as to allow for an electrical connection to the integrated circuit, being comprised by the circuit chip 3000. On the chip surface of the circuit chip 3000 there is arranged a passivating layer 3003, providing insulation and/or mechanical, physical, or chemical insulation of the circuit chip 3000. The passivating layer 3003 includes openings 3002 in an area of the contact fields 3001, in order to allow for a connection to the contact fields 3001. The contact fields 3001 may include FE-pads.

Figure 3B:
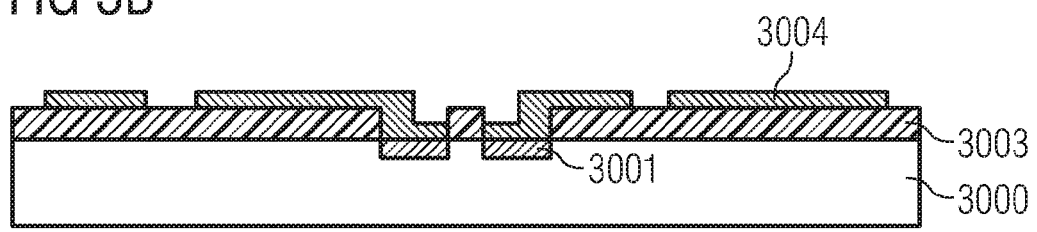

As illustrated in FIG. 3B, signal lines 3004 are provided on the chip surface of the circuit chip 3000, establishing a contact to the contact fields 3001. The signal lines 3004 may be part or form a redistribution layer, such as to allow for a rerouting of a signal from a position of the contact field 3001 to another position in the chip plane. The signal lines 3004 may be provided by using depositing a conductive layer, such as a metal layer, and a subsequent structuring of the conductive layer. Structuring, in turn, may include photolithography, UV-lithography, electron beam lithography, developing, anisotropic etching, and/or selective wet etching.

Figure 3C:
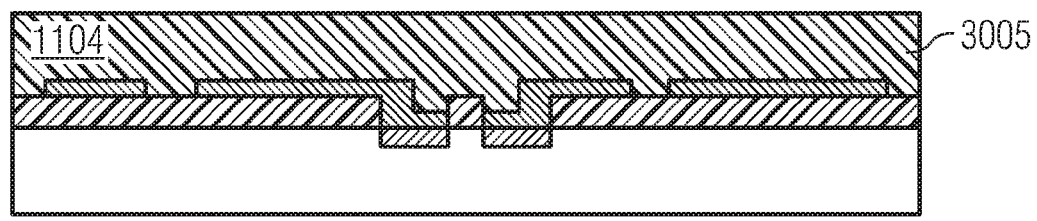

As illustrated in FIG. 3C, an insulating layer 3005 is provided on the chip surface, covering the signal lines 3004. The insulating layer 3005 includes the flexible material 1004, as this has been described in conjunction with one embodiment.

As illustrated in FIG. 3D, openings 3006 are provided in the insulating layer 3005. In the case that the insulating layer 3005 includes a photosensitive material, the openings may be created by a photolithographic process, which, in turn, may include a selected exposure to radiation, such as light, UV-light, or an electron beam, and a subsequent developing of the exposed layer. Providing the openings 3006 may include a provision of an etching mask on a surface of the insulating layer 3005 and an etching process, such as an anisotropic etching, reactive ion etching, and/or ion etching. The openings 3006 are provided on respective positions, in order to allow an access of the respective signal lines 3004.

As illustrated in FIG. 3E, the openings 3006 of the insulating layer 3005 are filled with the conductive material 1002, such as to form contact pillars 3008. In this way, a contact may be established to the signal lines 3004, being still accessible by a respective cross section of the contact pillar 3008 on a surface of the insulating layer 3005.

As illustrated in FIG. 3F, contact pads 3009 are provided on a surface of the insulating layer 3005, such as to establish a contact to the contact pillars 3008, and, in turn, to the signal lines 3004. In this way, the function entities and/or the integrated circuit being comprised by the circuit chip 3000 may be connected by using connecting to the contact pads 3009. The provision of the contact pads 3009 may be effected by using a sputtering, a plating, and/or a photolithographic technique. An initially continuous layer may be structured such to provide individual contact pads and/or signal lines.

Figure 3G:
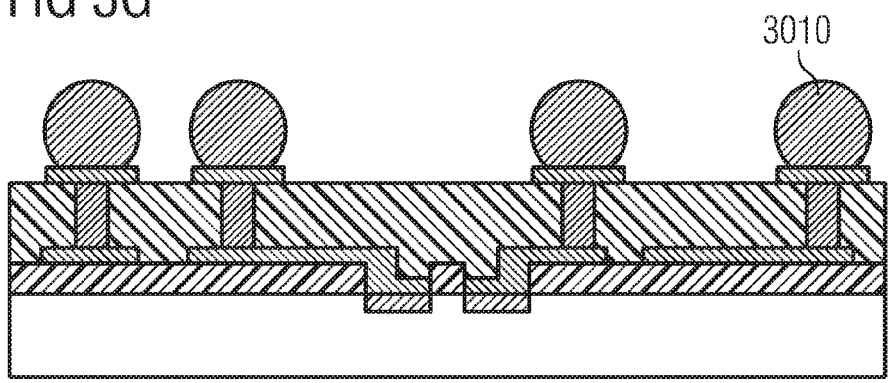

As illustrated in FIG. 3G solder balls 3010 are provided on the contact pads 3009. In this state during manufacturing, or in the state as has been described in conjunction with FIG. 3F, a ready integrated circuit 3200 may be formed, which may be shipped, handled and/or processed separately. The solder balls 3010 may be provided by using a ball-drop technique, or may be replaced or effected by a provision of a soldering paste.

Figure 3H:
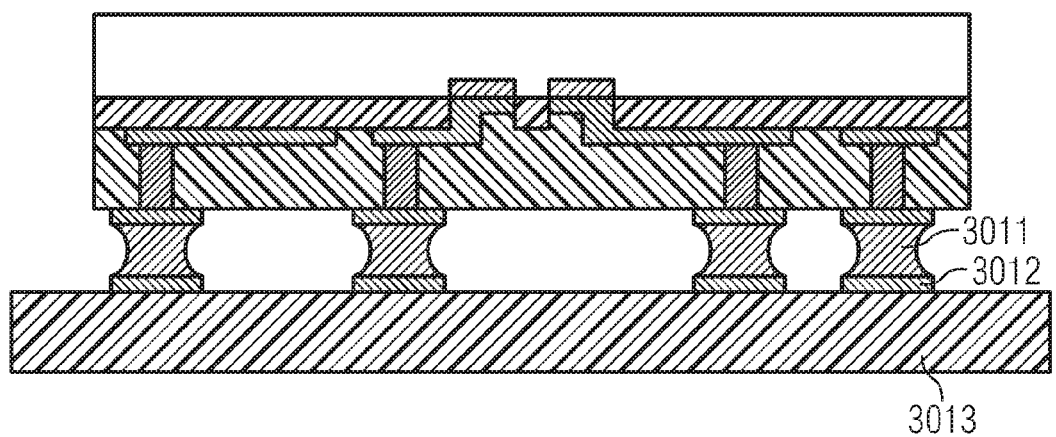

As illustrated in FIG. 3H, the integrated circuit 3200 is connected to a circuit board 3013 in order to form a circuit system, such as a circuit system which has been described in conjunction with FIGS. 1A through 1C. The circuit board 3013, may be or include a printed circuit board and/or other integrated circuits, such as to form a circuit system, such as a computer system, a memory module, a system in package, a multi-chip module, a mainboard, a graphics board, and/or an application board. The integrated circuit 3100 is connected to the circuit board 3013 by using solder connections 3011, which connect the respective contact pads 3009 to respective contact pads 3012 which are arranged on the circuit board 3030. Suitable soldering processes include flux-dipping, reflow soldering, infrared soldering, and related techniques.

Figure 4A:
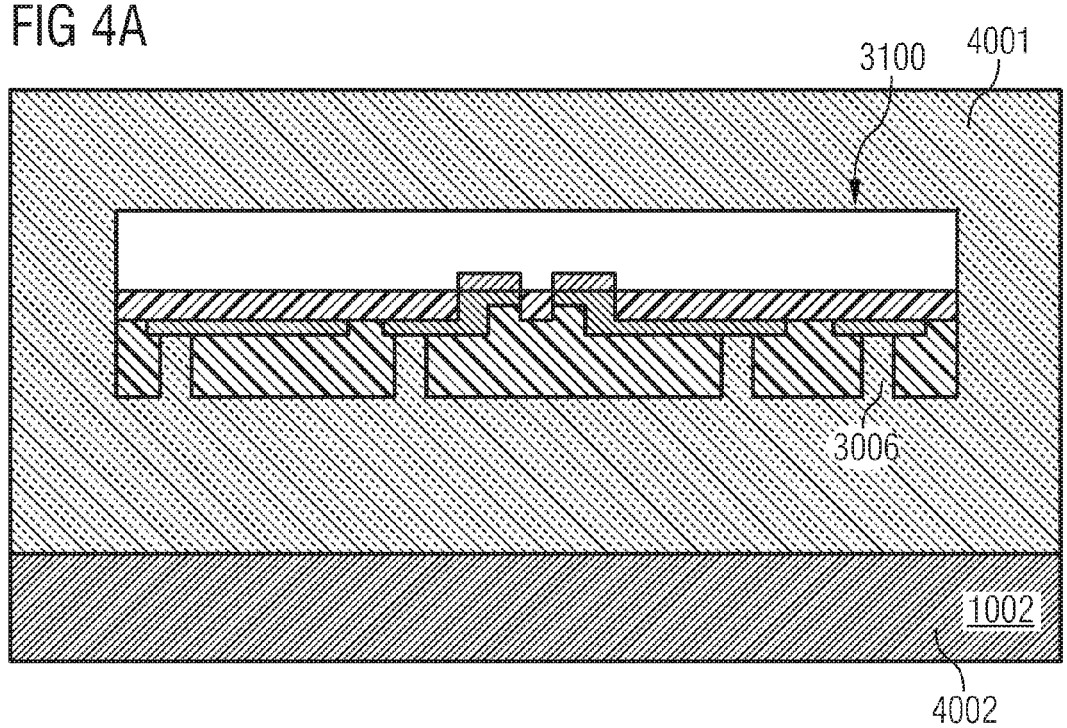

FIGS. 4A through 4D illustrate the integrated circuit 3100 in various stages during manufacturing according to one embodiment. According to this embodiment, the openings 3006 in the insulating layer 3005 are filled with the conductive material 1002 by using a pressure-induced filling process. As illustrated in FIG. 4A the integrated circuit 3100 in this stage during manufacturing is provided within a process atmosphere 4001. The process atmosphere 4001 may provide a first pressure, may be a vacuum or a low pressure atmosphere with a first pressure which is less than a second pressure. The integrated circuit 3100 is provided in this process atmosphere 4001 in a vicinity to a bath 4002 of the conductive material 1002 in a viscous or a liquid state.

Figure 4B:
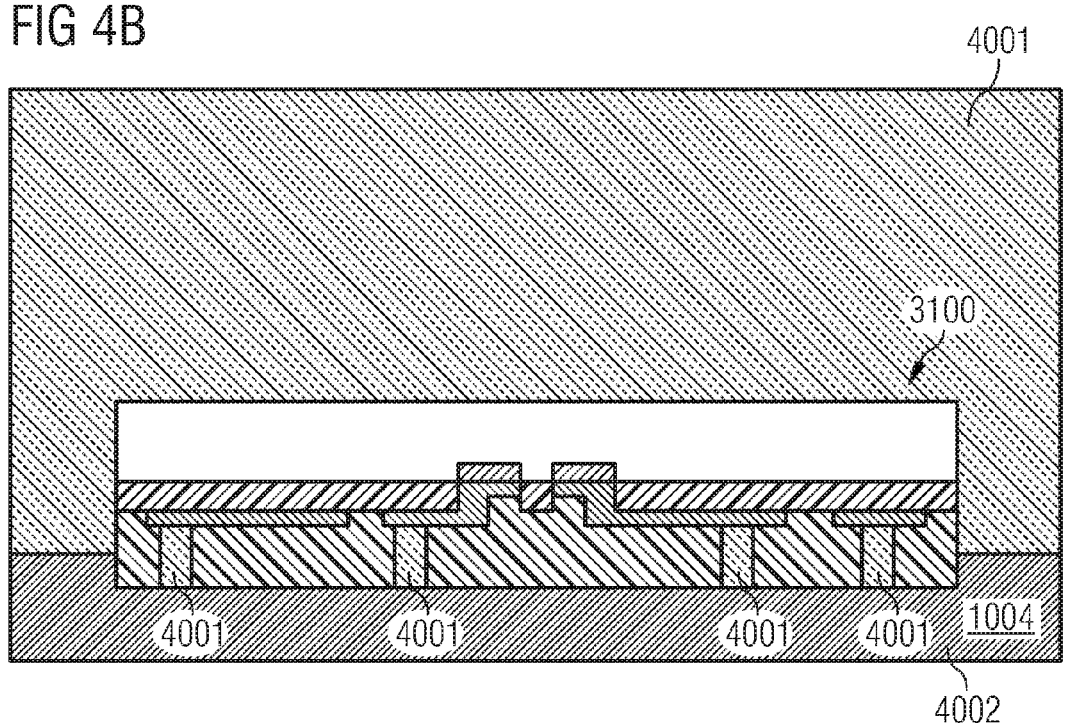

As illustrated in FIG. 4B the liquid conductive material 1002 is provided around an aperture of the openings 3006 of the insulating layer 3005, by using, for example, dipping the integrated circuit 3100 into the bath 4002. During this stage the first process atmosphere 4001 and a respective pressure still acts in the openings 3006 of the insulating layer 3005.

As illustrated in FIG. 4C, a second process atmosphere 4003 is provided around the bath 4002 of the conductive material 1002. A pressure of the second process atmosphere 4003 may be an atmospheric pressure, a high pressure, or a second pressure which is larger than the first pressure. In this way, the liquid flexible material 1002 is pressed into the openings 3006 of the insulating layer 3005. In this way an intermediate integrated circuit 3199 is formed, including filled openings within the insulating layer 3005.

As illustrated in FIG. 4D, the integrated circuit 3199 is extracted from the material bath 4002, wherein the openings 4006 still remained filled with the liquid material 1002. By using a solidification of the liquid material 1002 in the openings 4006 of the insulating layer 3005, contact pillars 3008 are formed, which provide an integrated circuit 3200. Solidification may be effected by using cooling the integrated circuit 3199 below a melting temperature of the conductive material 1002. For example, the material bath 4002 may be a bath of a solder material, the conductive material 1002 being a solder material, and including, for example, tin, lead, copper, silver, bismuth, indium, urea, zinc chloride, colophony, and or a flux material. In such a case, the integrated circuit 3199 may be cooled below the melting temperature such as to form solid and reliable contact pillars 3008. In the case of common solder materials, such a melting temperature may be in a range of 150° C. to 250° C. In this way, at normal, ambient temperatures and/or even elevated operation temperatures, the conductive material 1002 may remain solid and may provide a reliable and stable contact pillar 3008.

According to one embodiment, a conductive spacer, such as the contact pillars, may be formed by such a method, while providing process simplicity, reliability, low cost, and an enhanced aspect ratio above 2:1. The aspect ratio is the ratio of a length of a conductive spacer divided by a width of such a spacer.

According to another embodiment, a high aspect ratio provides a reduced cross section of a contact pillar, which may, in turn, reduce a thermo-mechanical coupling between the contact pad and the respective signal line. This may be an advantage, if circuit chips include stress-sensitive materials, such as high-k dielectric materials.

According to yet another embodiments of the present invention, an underfilling of an wafer level package (WLP) may be rendered obsolete, a robustness of a WLP or circuit system may be increased, a robustness of a WLP or circuit system against dropping may be increased, a robustness of a WLP or circuit system against mechanical shocks may be increased and/or standard solder balls may be applied.

According to yet another embodiments, the flexible material may be or include an insulating material. The integrated circuit may furthermore include a first signal line between the circuit chip and the insulating layer, the first signal line coupling the first contact field to the contact pillar. Additionally, the integrated circuit may include a contact pad on the insulating layer, the contact pad being coupled to the contact pillar. Also, the integrated circuit may include a second signal line on the insulating layer, the second signal line coupling the contact pad to the contact pillar. Furthermore, the insulating layer may include a trench.

According to yet further embodiments, the printed circuit board may include a board material with a first coefficient of thermal expansion and the circuit chip including a chip material with a second coefficient of thermal expansion. Furthermore, the first coefficient of thermal expansion and the second coefficient of thermal expansion may differ at least by 10 percent.

According to a further embodiment, a liquid state of the conductive material may include a viscous state, wherein, for example, the conductive material includes a material in a granular solid state. Furthermore, according to one embodiment, the flexible material may be or include a first flexible material and the conductive material may be or include a second flexible material.

The preceding description only describes exemplary embodiments of the invention. The features disclosed therein and the claims and the drawings can, therefore, be important for the realization of the invention in its various embodiments, both individually and in any combination. While the foregoing is directed to embodiments of the present invention, other and further embodiments of this invention may be devised without departing from the basic scope of the invention, the scope of the present invention being determined by the claims that follow.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a circuit chip comprising a first contact field on a chip surface;
   an insulating layer on the chip surface, the insulating layer comprising a flexible photoresist material, wherein an opening is provided in the insulating layer by a photolithographic process; and
   a contact pillar being coupled to the first contact field and extending from the chip surface through the insulating layer, the contact pillar comprising a conductive material, wherein the opening provided in the insulating layer is filled with the conductive material to form the contact pillar,
   wherein the insulating layer completely surrounds a length of the contact pillar.

2. The integrated circuit of claim 1, further comprising:
   a contact pad on the insulating layer, the contact pad being coupled to the contact pillar.

3. The integrated circuit of claim 2, comprising:
   a solder ball being arranged on the contact pad.

4. The integrated circuit of claim 1, the conductive material comprising:
any one of the group of a solder material, tin, copper, silver, lead, bismuth, indium, a bond wire material, gold, and/or aluminium.

5. The integrated circuit of claim 1, comprising:
a package, the package at least in part surrounding the circuit chip and the insulating layer and comprising a material different from the insulating layer.

6. The integrated circuit of claim 1, comprising:
a package, the package at least in part surrounding the circuit chip and comprising a material different from the insulating layer, and the insulating layer being arranged on the chip surface and the package.

7. The integrated circuit of claim 1, comprising:
a further contact pillar being coupled to a further contact field of the circuit chip and extending from the chip surface through the insulating layer, the further contact pillar comprising a larger cross-section than the contact pillar.

8. The integrated circuit of claim 1, comprising:
a group of further contact pillars being coupled to a further contact field of the circuit chip, the further contact pillars of the group being arranged surrounding the contact pillar.

9. The integrated circuit of claim 1, comprising:
a hollow contact pillar being coupled to a further contact field of the circuit chip, the hollow contact pillar being arranged surrounding the contact pillar.

10. The integrated circuit of claim 1, comprising:
a further insulating layer directly contacting the insulating layer;
an intermediate signal line between the insulating layers; and
a further contact pillar extending through the further insulating layer, the intermediate signal line coupling the two contact pillars.

11. The integrated circuit of claim 1, comprising:
the conductive material on a side face of the integrated circuit.

12. The integrated circuit of claim 1, comprising:
the conductive material on an edge of a side face of the integrated circuit.

13. The integrated circuit of claim 1, comprising:
a chip stack, the circuit chip being part of the chip stack.

14. The integrated circuit of claim 1, wherein trenches are provided in the insulating layer such that the contact pillar is arranged in an island of the flexible material and the photoresist material.

15. The integrated circuit of claim 1, further comprising:
a group of further contact pillars being coupled to the first contact field and extending from the chip surface through the insulating layer; and
a contact pad on the insulating layer, the contact pad being coupled to the contact pillar and the group of further contact pillars.

16. A circuit system comprising
a circuit board comprising a contact pad on a board surface; and
an integrated circuit being arranged on the board surface, the integrated circuit comprising a circuit chip comprising a contact field on a chip surface; an insulating layer on the chip surface, the insulating layer comprising a flexible photoresist material, wherein an opening is provided in the insulating layer by a photolithographic process; and a contact pillar being coupled to the first contact field and extending from the chip surface through the insulating layer, the contact pillar comprising a conductive material, and being coupled to the contact pad of the circuit board, wherein the opening provided in the insulating layer is filled with the conductive material to form the contact pillar,
wherein the insulating layer completely surrounds a length of the contact pillar.

17. The system of claim 16, comprising:
a further contact pad being coupled to the contact pillar; and
the further contact pad of the integrated circuit being coupled to the contact pad of the circuit board using a solder connection.

18. The system of claim 16, comprising a package comprising a material different from the insulating layer, the package being arranged on the board surface and surrounding the integrated circuit.

19. The system of claim 16, the circuit system being any from the group consisting of a memory module, a system-in-package, a computer mainboard, a multi chip module, or a part thereof.

20. The circuit system of claim 16, wherein trenches are provided in the insulating layer such that the contact pillar is arranged in an island of the flexible material and the photoresist material.

21. The circuit system of claim 16, further comprising:
a group of further contact pillars being coupled to the first contact field and extending from the chip surface through the insulating layer, the group of further contact pillars being coupled to the contact pad of the circuit board.

22. An integrated circuit comprising:
a circuit chip comprising a first contact field on a chip surface;
an insulating layer on the chip surface, the insulating layer comprising a flexible photosensitive material, wherein openings are provided in the insulating layer by a photolithographic process;
a group of contact pillars being coupled to the first contact field and extending from the chip surface through the insulating layer, each contact pillar comprising a conductive material, wherein the openings provided in the insulating layer are filled with the conductive material to form the contact pillars;
a package at least in part surrounding the circuit chip and comprising a material different from the insulating layer; and
a contact pad on the insulating layer, the contact pad being coupled to the group of contact pillars.

23. The integrated circuit of claim 22, wherein trenches are provided in the insulating layer such that the group of contact pillars is arranged in an island of the flexible photosensitive material.

24. The integrated circuit of claim 22, further comprising:
a further insulating layer directly contacting the insulating layer;
an intermediate signal line between the insulating layers; and
a further contact pillar extending through the further insulating layer and coupled to the intermediate signal line.

25. The integrated circuit of claim 1, wherein a length of the contact pillar in a direction perpendicular to the chip surface is greater than a width of the contact pillar in a direction parallel to the chip surface, and
wherein sidewalls of the contact pillar extending through the insulating layer are parallel to each other.

* * * * *